United States Patent
Deng et al.

(10) Patent No.: US 9,103,867 B2
(45) Date of Patent: Aug. 11, 2015

(54) APPARATUS AND METHOD FOR DETECTING THE ABNORMAL SOLDERING OF AN ELECTROSTATIC DISCHARGE PROTECTION CHIP

(75) Inventors: Mingfeng Deng, Guandong (CN);
Jungmao Tsai, Guandong (CN);
Songxian Wen, Guandong (CN);
Yizhuang Zhuang, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 217 days.

(21) Appl. No.: 13/697,358

(22) PCT Filed: Sep. 4, 2012

(86) PCT No.: PCT/CN2012/080976
§ 371 (c)(1),
(2), (4) Date: Nov. 11, 2012

(87) PCT Pub. No.: WO2014/023051
PCT Pub. Date: Feb. 13, 2014

(65) Prior Publication Data
US 2014/0043040 A1    Feb. 13, 2014

(51) Int. Cl.
*G01R 31/04*    (2006.01)
(52) U.S. Cl.
CPC ............ *G01R 31/048* (2013.01); *G01R 31/046* (2013.01)
(58) Field of Classification Search
CPC .... G01R 3/025; G01R 31/026; G01R 31/048; G01R 31/2896; G01R 31/04; G01R 31/31835; G01R 31/046; G01R 31/2812; G01R 31/2846; G01R 31/2853; G01R 31/318342; G01R 31/318536; G01R 31/318591; G01R 31/31915; G06K 2209/19; G06K 9/6206; G01N 27/9046
See application file for complete search history.

(56) References Cited

U.S. PATENT DOCUMENTS

| | | | | |
|---|---|---|---|---|
| 5,513,188 | A  * | 4/1996 | Parker et al. | 714/727 |
| 6,568,581 | B2 * | 5/2003 | Boller et al. | 228/103 |
| 6,750,418 | B1 * | 6/2004 | Nastasi, Jr. | 219/109 |
| 8,232,810 | B2 * | 7/2012 | Reynolds et al. | 324/662 |
| 2003/0202299 | A1 * | 10/2003 | Maloney et al. | 361/56 |
| 2005/0225754 | A1 * | 10/2005 | Ume et al. | 356/237.1 |
| 2008/0144243 | A1 * | 6/2008 | Mariani et al. | 361/56 |
| 2009/0089635 | A1 * | 4/2009 | Chen et al. | 714/727 |
| 2013/0120690 | A1 * | 5/2013 | Tsujii | 349/69 |

* cited by examiner

*Primary Examiner* — Vinh Nguyen
(74) *Attorney, Agent, or Firm* — Andrew C. Cheng

(57) ABSTRACT

The present invention provides an apparatus for detecting the abnormal soldering of an electrostatic discharge protection chip, comprising a connector, which is used for pluggable connection with a signal input terminal connector of an application specific integrated circuit chip (ASIC) of a liquid crystal display; a detecting circuit, which is set on the connector, used to detect if the electrostatic discharge protection chip is properly soldered on the ASIC and prompt when the abnormal soldering of the electrostatic discharge protection chip is detected. Accordingly, the present invention also provides a method for detecting the abnormal soldering of an electrostatic discharge protection chip. According to the present invention, the abnormal soldering of an electrostatic discharge protection chip can be detected quickly with high accuracy, which can save the cost of manpower and resources, as well as to reduce the loss resulted from the defective rate of the finished product assembly.

6 Claims, 5 Drawing Sheets

APPARATUS AND METHOD FOR DETECTING THE ABNORMAL SOLDERING OF AN ELECTROSTATIC DISCHARGE PROTECTION CHIP

This application claims priority to Chinese Patent Application Serial No. 201210282018.6, named as "an apparatus and method for detecting the abnormal soldering of an electrostatic discharge protection chip", filed on Aug. 9, 2012, the specification of which is incorporated herein by reference.

BACKGROUND OF THE INVENTION

1. Field of the Invention

The present invention relates to the field of thin Film Transistor Liquid Crystal Display (TFT-LCD), and in particular to an apparatus and method for detecting the abnormal soldering of an electrostatic discharge protection chip applied in the TFT-LCD.

2. The Related Arts

TDT-LCD has already become a very important display platform of modern information technologies and video products. FIG. 1 shows a typical architecture of TFT-LCD. The main driving principle of TFT-LCD is that the control system board connects the R/G/B (red/green/blue) compressed signal, the control signal, and the power to the connector 11 which is located on the printed circuit board (PCB) through wires, leading to the LCD panel (display region 12) obtains the required powers and signals.

The signal which is sent to the PCB through the connector 11 is mainly the format of low voltage differential signaling (LVDS). Wherein, each two LVDS connecting pins form a transmission channel, used for transmitting data or clock. One of the LVDS connecting pins is positive output, and the other is negative output. For example, in FIG. 1, LV1P0 and LV1N0 form a data channel. These LVDS signals on the PCB will be sent to source-chip on film (S-COF) and gate-chip on film (G-COF) through a application specific integrated circuit (ASIC), and control the LCD panel (display region 12) to display the data or the images through the S-COF and G-COF. In order to avoid damaging the ASIC resulted from the static electricity appeared when the connector 11 plugs in and out, the electronic static discharge (ESD) protection chip, which is referred to as ESD protection chip hereinafter, is provided at the connection between the connector 11 and the ASIC to the important signal.

FIG. 2 shows a schematic view illustrating the structure of the connection between the ESD protection chip 22 and the ASIC. The ESD protection chip 22 is provided with several LVDS connecting pins (two groups shown in FIG. 2), a ground pin (GND) and a power pin (VDD). Each group of LVDS connecting pins is connected with one group of LVDS connecting pins on the ASIC and one group of connecting pins on the connector 21. In FIG. 2, the pin 3 of the ESD protection chip 22 is connected with the ASIC and the pin LV1P0 on the connector 21, the pin 1 is connected with the ASIC and the pin LV1P1 on the connector 21; similarly, the other group of LVDS connecting pins (pin 4 and 6) are connected with the ASIC and the pin LV1P1 and pin LVIN1 on the connector 21.

Multiple diodes connected in a certain order (D1~D8) and zener diode D0 are provided inside the ESD protection chip 22.

It can be understood that only two groups of LVDS connecting pins are pointed out above. In the other embodiment, ESD protection chip 22 can protect more groups of LVDS connecting pins, the internal circuit of which is the same as the connection between the ASIC and the connector 21 shown in FIG. 2, which is not described in detail here.

FIG. 3 shows a schematic view illustrating the working principle of the ESD protection chip 22 shown in FIG. 2.

Take LV1P0 signal transmitted to the ASIC as example. Assume the characteristics of the diodes inside the ESD protection chip 22 are the same, the forward conduction voltage drop is $U_{D+}$ (such as 0.7V), and the reverse blocking voltage drop is $U_{D-}$ (such as 3V). Wherein, in the LVDS transmitting circuit, assume the voltage value of the transmission signal is U (such as 1.2V), the relationship between these three is $U_{D+}<U<U_{D-}$. When the normal LVDS signal is put into the connected LV1P0 connecting pins under normal condition, the zener diode D0 inside the ESD chip is under reverse blocking state. Therefore, the signal transmission route is shown as thick black line in FIG. 3, the signal can be normally transmitted to the ASIC pin LV1P0.

FIG. 4 shows a schematic view illustrating the working principle of the abnormal soldering of the ESD protection chip 22 shown in FIG. 2.

Take LV1P0 signal transmitted to the ASIC as example. When the ESD protection chip 22 is reversely soldered on the PCB plate, the signal transmission route is shown as thick black line in FIG. 4. When the normal LVDS signal is put into the LV1P0 connecting pins of the connector 21, the transmitted signal flows into the ground via the diode D1. At the moment, the voltage distortion at the ASIC pin LV1P0 is the conduction voltage drop $U_{D+}$ of the diode D1, which causes the abnormal signal output to the liquid crystal panel and results the abnormal display.

The existing detection of abnormally soldering of the ESD protection chip can only be achieved by visual observation. But the positive and negative signs of the ESD protection chip 22 are difficult to identify. Therefore, the abnormal products (the products soldered abnormally) is hard to be separated from the normal product (the products soldered correctly) by only using visual observation, which will result in the assembly problems.

SUMMARY OF THE INVENTION

The technical issue to be solved by the present invention is to provide an apparatus and method for detecting the abnormal soldering of an electrostatic discharge protection chip, which can conveniently and easily find out the products of the electrostatic discharge protection chip with abnormal soldering.

In order to solve the technical issue, the embodiment of the present invention provides an apparatus for detecting the abnormal soldering of an electrostatic discharge protection chip, comprising: a connector, which is used for pluggable connection with a signal input terminal connector of an application specific integrated circuit chip (ASIC) of a liquid crystal display; a detecting circuit, which is set on the connector, used to detect if the electrostatic discharge protection chip is properly soldered on the ASIC and prompt when the abnormal soldering of the electrostatic discharge protection chip is detected.

According to a preferred embodiment of the present invention, the inside of the connector is provided with a ground connection terminal and at least one low-voltage differential signal (LVDS) connection terminal, one end of the said ground connection terminal is used to be connected with the ground connection terminal of the signal input terminal connector of the ASIC, the said at least one LVDS connection terminal is connected with at least one LVDS connection terminal of the signal input terminal connector of the ASIC.

According to a preferred embodiment of the present invention, the detecting circuit comprises: a direct current power supply, the negative electrode of which is connected with the other end of the ground connection terminal; there is at least one connection located at a detecting branch between the positive electrode of the direct current power supply and a LVDS connection terminal of the connector, each said detecting branch comprises a detecting portion, the positive electrode of the detecting portion is connected with the positive electrode of the direct current power supply, the negative electrode of the detecting portion is connected with the LVDS connection terminal.

According to a preferred embodiment of the present invention, each said detecting branch further comprises a current-limiting resistor in series with the detecting portion.

According to a preferred embodiment of the present invention, when the electrostatic discharge protection chip is properly soldered on the ASIC, the connector is electrically connected with the signal input terminal connector of the ASIC, the direct current power supply and each detecting branch cannot form a loop, and the detecting portion of each said detecting branch prompts in a first way; when the electrostatic discharge protection chip is abnormally soldered on the ASIC, the connector is electrically connected with the signal input terminal connector of the ASIC, the direct current power supply, at least one detecting branch and the electrostatic discharge protection chip form a loop, and the detecting portion of the detecting branch prompts in a second way.

According to a preferred embodiment of the present invention, the detecting portion of each said detecting branch is a light emitting diode or a buzzer; the detecting portion prompting in the first way is the light emitting diode not emitting light or the buzzer not sounding; the detecting portion prompting in the second way is the light emitting diode emitting light or the buzzer sounding.

Accordingly, the embodiment of the present invention further provides a method for detecting the abnormal soldering of an electrostatic discharge protection chip comprising: inserting a connector of a detecting apparatus into a signal input terminal connector of an ASIC of a liquid crystal display by electrically connection; according to the prompt of a detecting circuit on the detecting apparatus, determining whether the electrostatic discharge protection chip is properly soldered on the ASIC.

According to a preferred embodiment of the present invention, the practical steps of inserting the connector of the detecting apparatus into the signal input terminal connector of the ASIC of the liquid crystal display by electrically connection are as follows. The detecting apparatus is inserted into the signal input terminal connector of the ASIC of the liquid crystal display, which makes the ground connection terminal set inside the connector be connected with the ground connection terminal of the signal input terminal connector of the ASIC, and makes at least one LVDS connection terminal set inside the connector be connected with at least one LVDS connection terminal of the signal input terminal connector of the ASIC.

According to a preferred embodiment of the present invention, the detecting steps are as follows. When the electrostatic discharge protection chip is properly soldered on the ASIC, the direct current power supply and the detecting branch connected with each other between the ground connection terminal of the detecting apparatus and the LVDS connection terminal cannot form a loop, and the detecting portion of each said detecting branch prompts in a first way; when the electrostatic discharge protection chip is abnormally soldered on the ASIC, the direct current power supply and the detecting branch connected with each other between the ground connection terminal of the detecting apparatus and the LVDS connection terminal form a loop, and the detecting portion of the detecting branch prompts in a second way.

According to a preferred embodiment of the present invention, the detecting portion of each said detecting branch is a light emitting diode or a buzzer; the detecting portion prompting in the first way is the light emitting diode not emitting light or the buzzer not sounding; the detecting portion prompting in the second way is the light emitting diode emitting light or the buzzer sounding.

Accordingly, the embodiment of the present invention further provides an apparatus for detecting the abnormal soldering of an electrostatic discharge protection chip comprising: a connector, which is used for pluggable connection with a signal input terminal connector of an application specific integrated circuit chip (ASIC) of a liquid crystal display, the inside of the connector provided with a ground connection terminal and at least one low-voltage differential signal (LVDS) connection terminal, one end of the said ground connection terminal used to be connected with the ground connection terminal of the signal input terminal connector of the ASIC, the said at least one LVDS connection terminal connected with at least one LVDS connection terminal of the signal input terminal connector of the ASIC; and a detecting circuit set on the connector, the detecting circuit comprising: a direct current power supply, the negative electrode of which is connected with the other end of the ground connection terminal; and at least one connection located at a detecting branch between the positive electrode of the direct current power supply and a LVDS connection terminal of the connector, each said detecting branch comprising a detecting portion, the positive electrode of the detecting portion connected with the positive electrode of the direct current power supply, the negative electrode of the detecting portion is connected with the LVDS connection terminal; the detecting portion prompting when the abnormal soldering of the electrostatic discharge protection chip and the ASIC is detected.

According to a preferred embodiment of the present invention, each said detecting branch further comprises a current-limiting resistor in series with the detecting portion.

According to a preferred embodiment of the present invention, when the electrostatic discharge protection chip is properly soldered on the ASIC, the connector is electrically connected with the signal input terminal connector of the ASIC, the direct current power supply and each detecting branch cannot form a loop, and the detecting portion of each said detecting branch prompts in a first way; when the electrostatic discharge protection chip is abnormally soldered on the ASIC, the connector is electrically connected with the signal input terminal connector of the ASIC, the direct current power supply, at least one detecting branch and the electrostatic discharge protection chip form a loop, and the detecting portion of the detecting branch prompts in a second way.

According to a preferred embodiment of the present invention, the detecting portion of each said detecting branch is a light emitting diode or a buzzer; the detecting portion prompting in the first way is the light emitting diode not emitting light or the buzzer not sounding; the detecting portion prompting in the second way is the light emitting diode emitting light or the buzzer sounding.

The apparatus and method for detecting the abnormal soldering of an electrostatic discharge protection chip according to the embodiment of the present invention have beneficial effects as follows:

A detecting apparatus is provided, and there are a connector and at least one detecting branch set in the detecting apparatus. The detecting apparatus is connected with a signal input terminal connector of an application specific integrated circuit chip (ASIC) of a liquid crystal display. By detecting the status of the detecting portion in the detecting branch (such as the first way and the second way), it can be known whether the ESD protection chip of the ASIC is soldered abnormally (such as soldered reversely). For example, the detecting branch can be a light emitting diode or a buzzer. When the light emitting diode emits light or the buzzer sounds, it determines that the ESD protection chip is soldered abnormally. If the light emitting diode doesn't emit light or the buzzer doesn't sound, it determines that the ESD protection chip is soldered normally.

By using the embodiment of the present invention, the operation of the detecting process is very simple and quick with very high accuracy, which can save the cost of manpower and resources, as well as to reduce the loss resulted from the defective rate of the finished product assembly.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

The detailed descriptions according to the preferred embodiment of the present invention are as follows.

Figure 1:
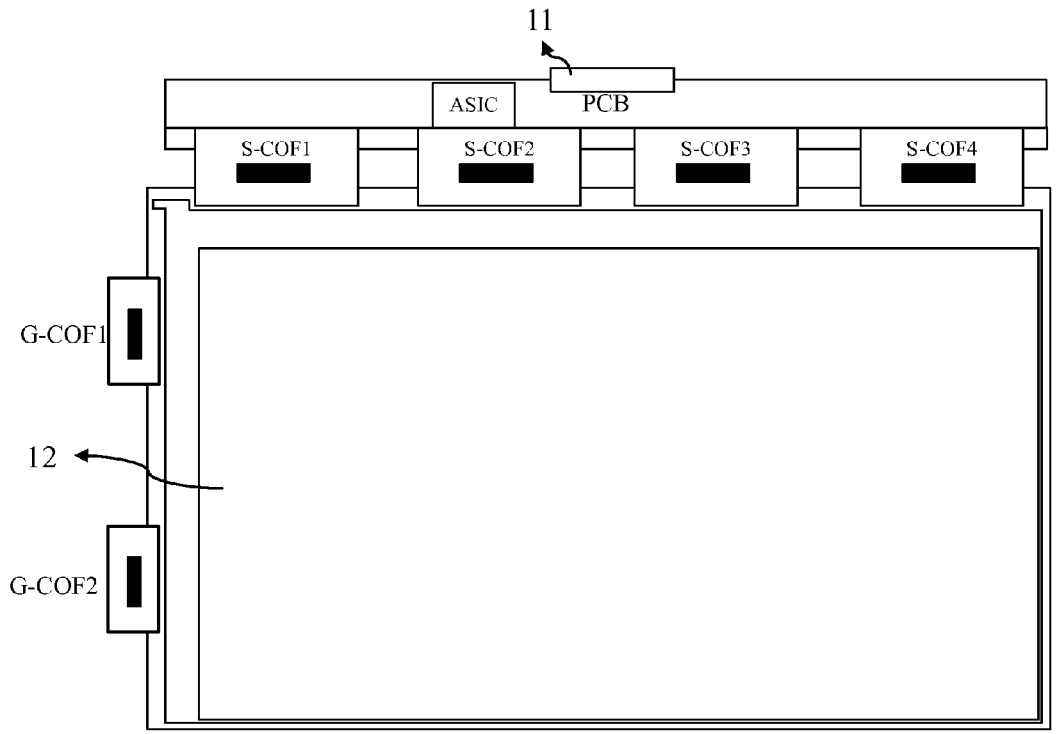
FIG. 1 is a schematic view illustrating the structure of the typical TFT-LCD.
Figure 2:
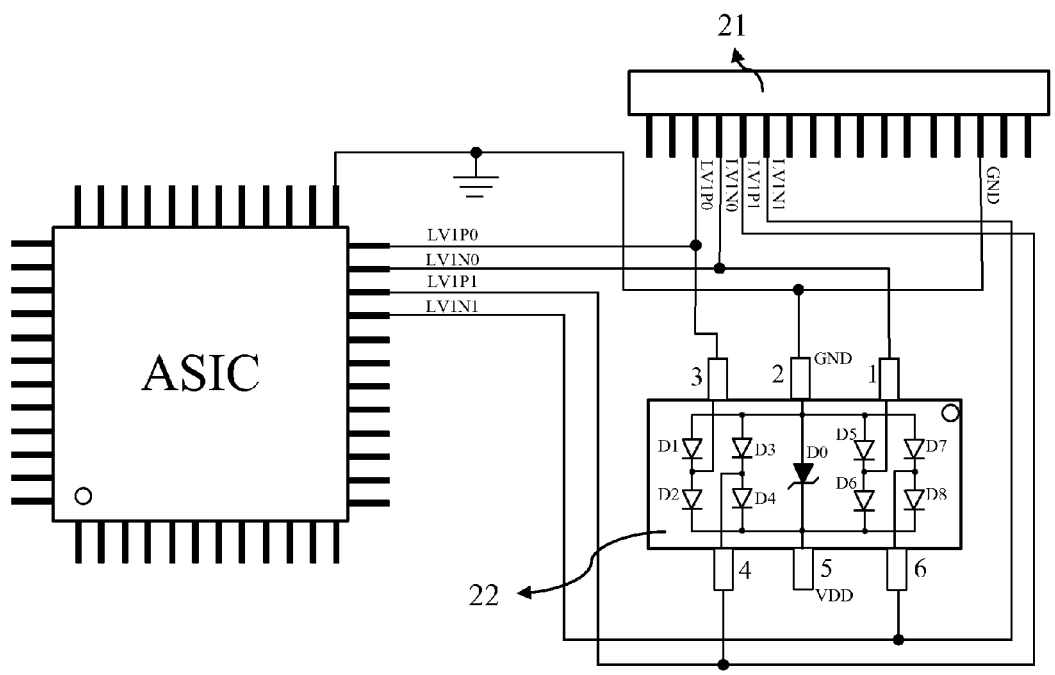
FIG. 2 is a schematic view illustrating the structure of the connection between the ESD protection chip and the ASIC.
Figure 3:
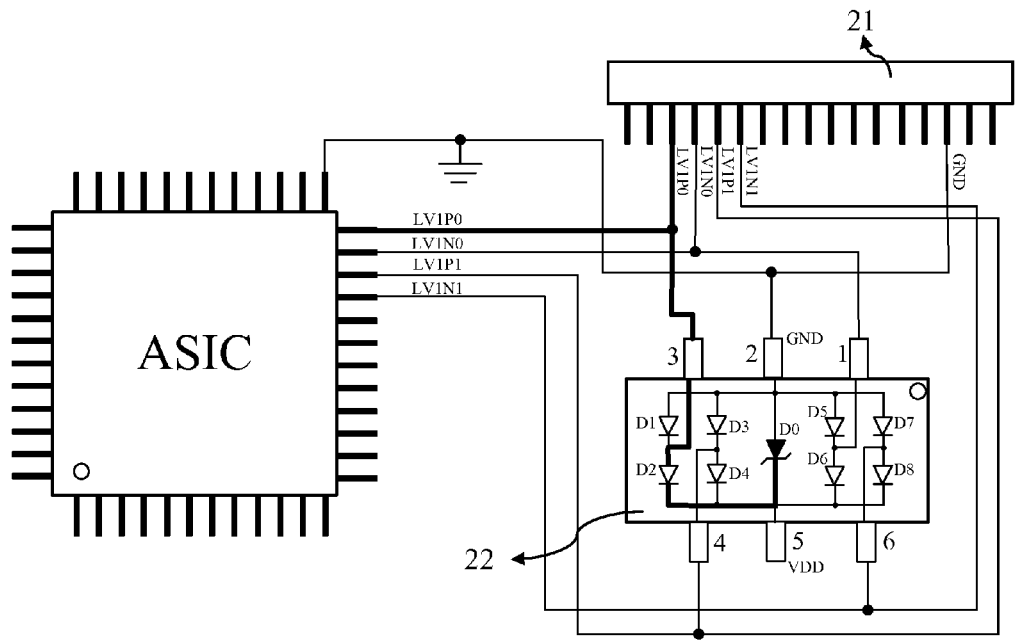
FIG. 3 is a schematic view illustrating the working principle of the ESD protection chip shown in FIG. 2.
Figure 4:
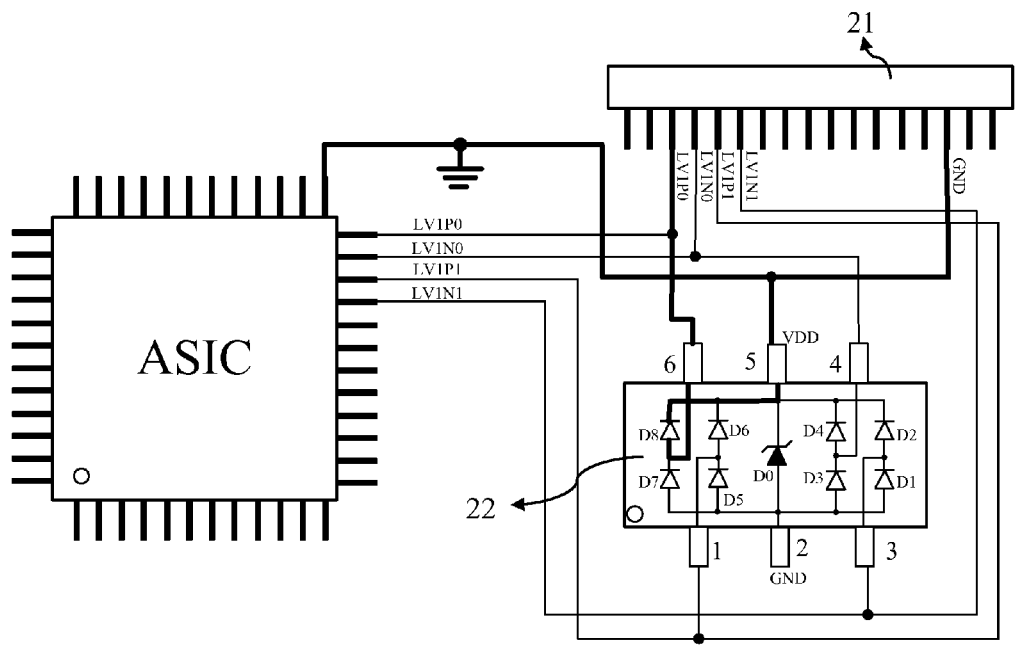
FIG. 4 is a schematic view illustrating the working principle of the abnormal soldering of the ESD protection chip shown in FIG. 2.
Figure 5:
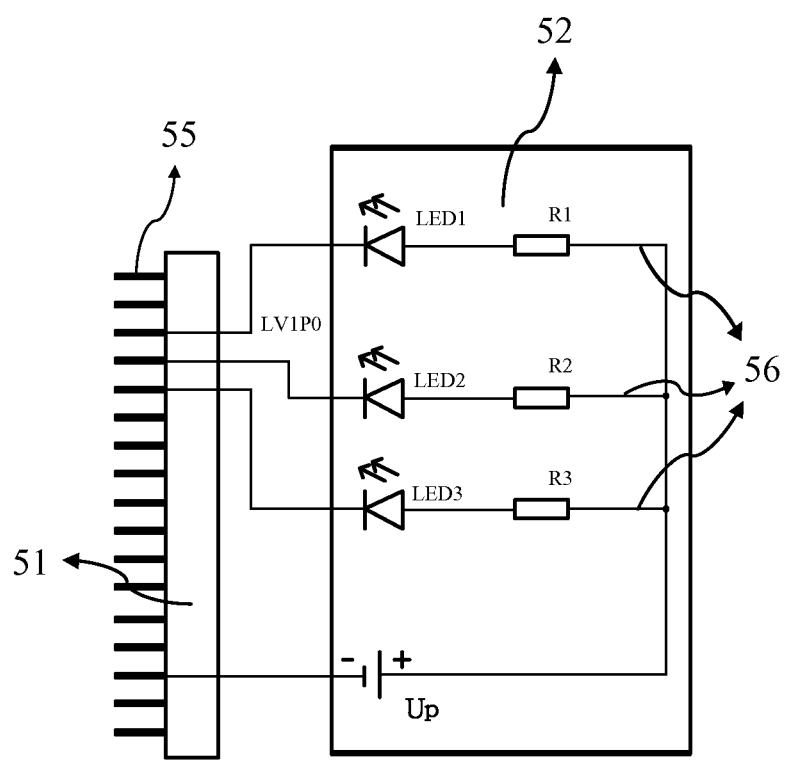
FIG. 5 is a schematic view illustrating the structure of the embodiment of the apparatus for detecting the abnormal soldering of the ESD protection chip according to the present invention.

FIG. 5 is a schematic view illustrating the structure of the embodiment of the apparatus for detecting the abnormal soldering of the ESD protection chip 54 according to the present invention. From FIG. 5, the apparatus for detecting the abnormal soldering of the ESD protection chip 54 comprises: a connector 51, which is used for pluggable connection with a signal input terminal connector 53 of an ASIC of TFT-LCD; a detecting circuit 52, which is set on the connector 51, used to detect if the ESD protection chip 54 is properly soldered on the ASIC and prompt when the abnormal soldering of the ESD protection chip 54 is detected.

Wherein, the inside of the connector 51 is provided with a ground connection terminal (GND) and at least one LVDS connection terminal 55, one end of the said ground connection terminal is used to be connected with the ground connection terminal of the signal input terminal connector 53 of the ASIC, each LVDS connection terminal 55 is connected with a LVDS connection terminal 55 of the signal input terminal connector 53 of the ASIC.

The detecting circuit 52 connected with the connector 51 comprises: a direct current power supply Up, the negative electrode of which is connected with the other end of the ground connection terminal; there is at least one connection located at a detecting branch 56 between the positive electrode of the direct current power supply Up and a LVDS connection terminal 55 of the connector 51, wherein each said detecting branch 56 comprises a detecting portion which is light emitting diode shown in Figure, the positive electrode of the detecting portion is connected with the positive electrode of the direct current power supply Up, the negative electrode of the detecting portion is connected with the LVDS connection terminal 55. There are three detecting branches shown in FIG. 5, the detecting portions of the each detecting branch 56 are LED1, LED2, and LED3, respectively. The present invention is not limited thereto, the detection branch can be provided depending on the number of LVDS connection terminal 55 of the connector 51.

Wherein, each said detecting branch 56 further comprises a current-limiting resistor in series with the detecting portion, which is R1, R2, and R3 shown in FIG. 5, used to protect the light emitting diode on the each detecting branch 56.

Wherein, the suitable parameters of the power supply UP, the current-limiting resistor and the light emitting diode is chosen to meet the following formula:

$$Up=R*I+U$$

Wherein, UP is the voltage drop of the direct current power supply, R is the resistance value of the current-limiting resistor of each detecting branch 56, I is the rated current of the light-emitting diode of the detecting branch 56, U is the voltage value of the transmission signal (i.e. LDVS signal).

Figure 6:
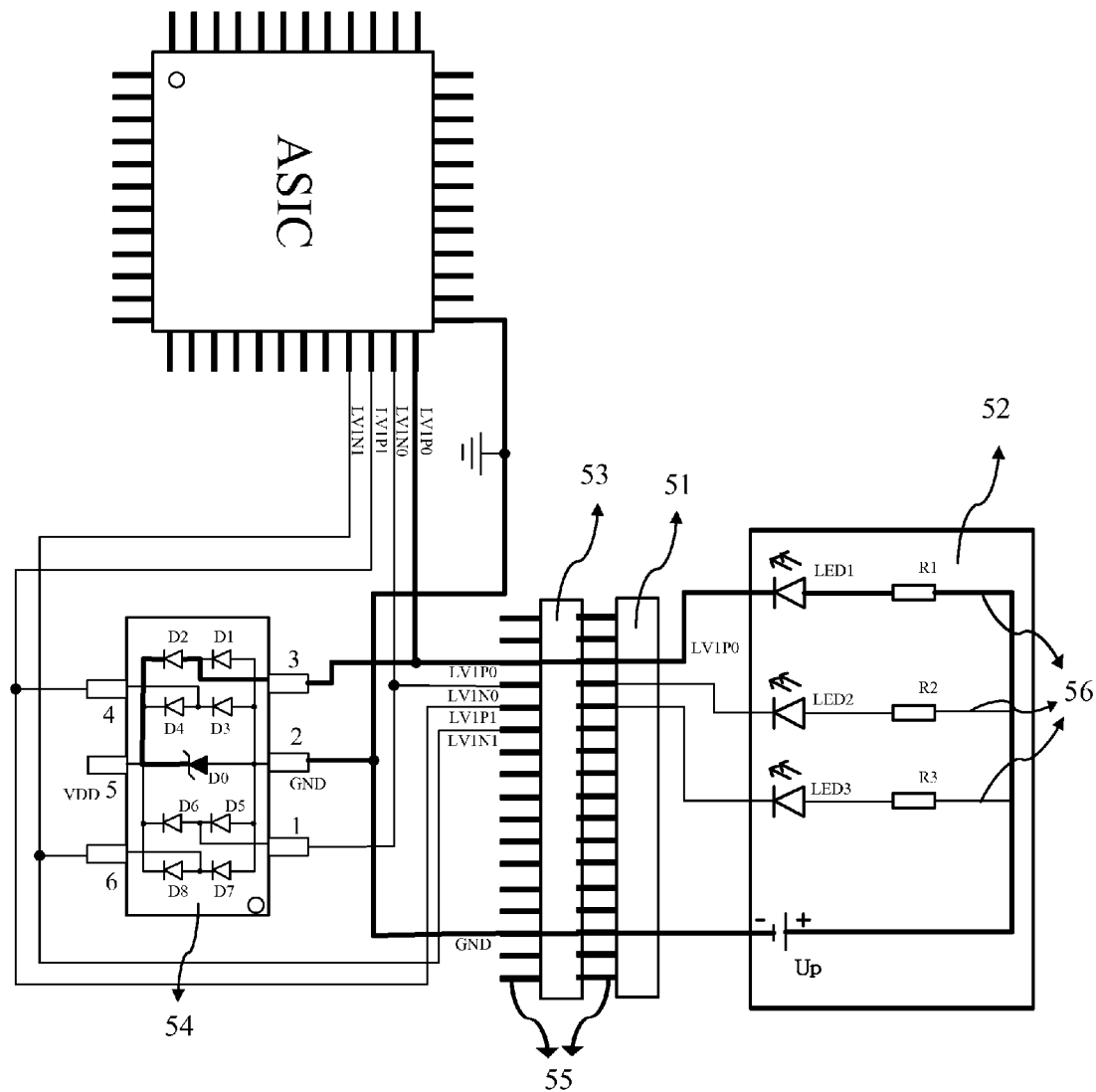
FIG. 6 is a schematic view illustrating the detecting principle when the ESD protection chip shown in FIG. 5 is soldered normally.

FIG. 6 is a schematic view illustrating the detecting principle when the ESD protection chip 54 shown in FIG. 5 is soldered normally;

The detecting apparatus is connected with the signal input terminal connector 53 of the ASIC of TFT-LCD. When ESD protection chip 54 is properly soldered on the ASIC, take a first detecting branch 56 as example, the signal output circuit is thick black line shown in FIG. 6. It can be seen that the current flows out the positive electrode of the direct current power supply through LED1 and then transmits to the ESD protection chip 54 circuit corresponding to LV1P0. Because the reverse dropout voltage of the zener diode D0 in the ESD protection chip 54 is larger than the input voltage Up, there is no current passing through the ESD protection chip 54 into the ground terminal, that is to say, the direct current power supply and the detecting branch 56 cannot form a loop. Therefore, LED1 cannot emit light, indicating that the ESD protection chip 54 is normal. The condition of LED1 not emitting light is called the detecting portion of the detecting branch 56 prompting in the first way.

Because the signal transmissions of the other detecting branches are the same as that of the first detecting branch 56, which is not described in detail here.

Figure 7:
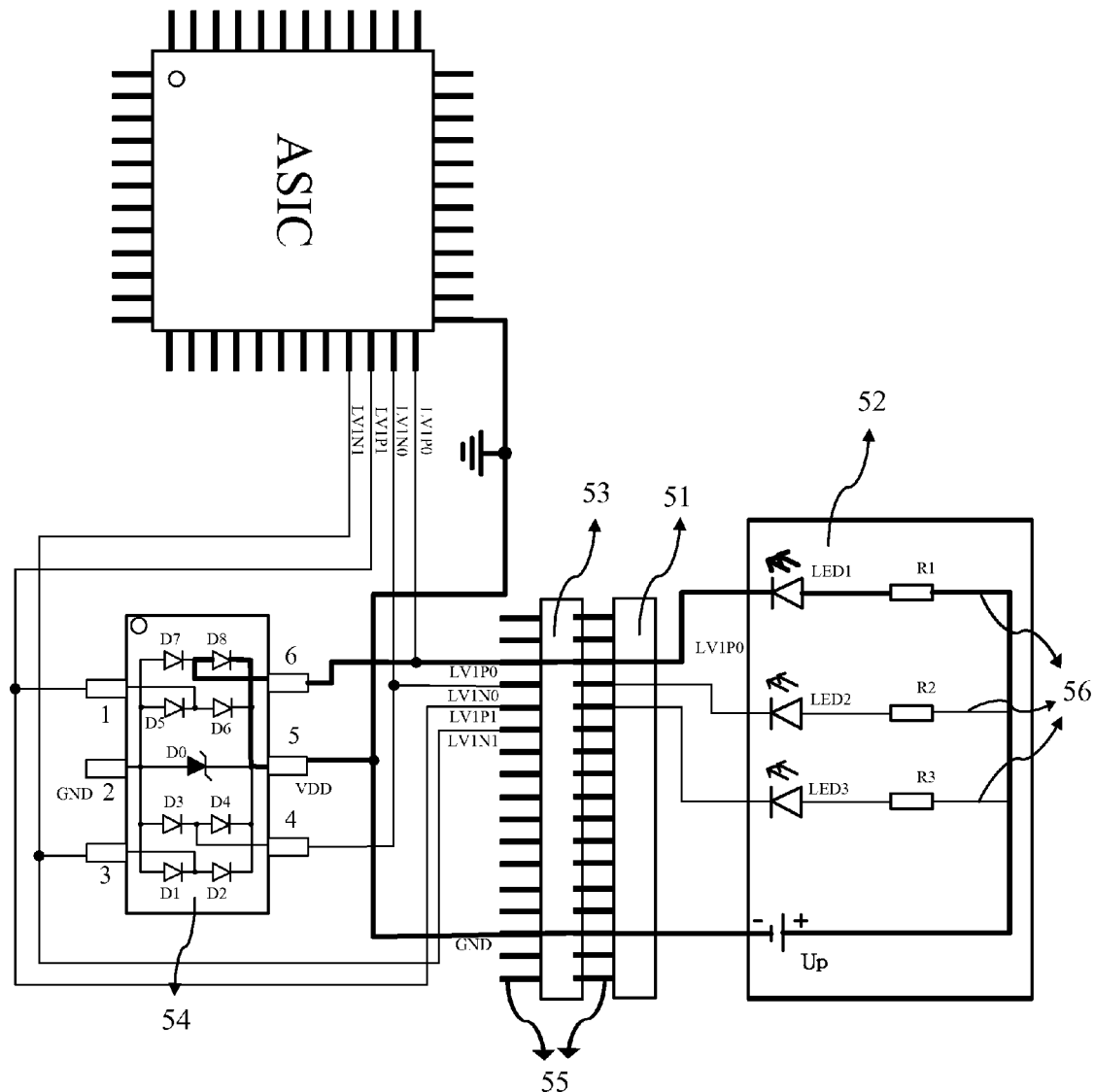
FIG. 7 is a schematic view illustrating the detecting principle when the ESD protection chip shown in FIG. 5 is soldered abnormally.

FIG. 7 is a schematic view illustrating the detecting principle when the ESD protection chip 54 shown in FIG. 5 is soldered abnormally.

The detecting apparatus is connected with the signal input terminal connector 53 of the ASIC of TFT-LCD. When ESD protection chip 54 is properly soldered on the ASIC, take a first detecting branch 56 as example, the signal output circuit is thick black line shown in FIG. 7. It can be seen that the current flows out the positive electrode of the direct current power supply through LED1 and then transmits to the ESD protection chip 54 circuit corresponding to LV1P0 and then into the ground terminal, that is to say, the direct current power supply and the detecting branch 56 form a loop. Therefore, LED1 emits light. The condition of LED1 emitting light is called the detecting portion of the detecting branch 56 prompting in the second way.

Because the signal transmissions of the other detecting branches are the same as that of the first detecting branch 56, which is not described in detail here.

It can be seen from above that it only needs to connect the detecting apparatus with the signal input terminal connector 53 of the ASIC of TFT-LCD. According to the bright-dark state of the light-emitting diodes in the detecting circuit 52, it can quickly determine if the ESD protection chip 54 located at the corresponding location is soldered abnormally (reverse). Specifically, if the light emitting diode in the detecting circuit the detecting apparatus doesn't emit light, it means the soldering of the ESD protection chip 54 is normal; if the light emitting diode in the detecting circuit 52 of the detecting apparatus emits light, it means the soldering of the ESD protection chip 54 is abnormal, that is to say, soldering reversely.

It is understood that the light emitting diode is used as the detecting portion in the above embodiment. In the other embodiment, the other components may also be used to achieve the detecting function. For example, use the buzzer as the detecting portion instead of the light emitting diode, which prompts by sounding or not. The detecting portion prompting in the first way is the buzzer not sounding; the detecting portion prompting in the second way is the buzzer sounding. The specific principle of the circuit is the same as FIGS. 5 and 7, which is not described in detail here.

Accordingly, the embodiment of the present invention provides a method for detecting the abnormal soldering of an ESD protection chip 54. The steps is as follows:

Step one: Electrically connect the connector 51 of the detecting apparatus with the signal input terminal connector 53 of the ASIC of the liquid crystal display, by the connection, the ground connection terminal inside the connector 51 is connected with the ground connection terminal of the signal input terminal connector 53 of the ASIC, which makes at least one LVDS connection terminal 55 inside the connector 51 connected with at least one LVDS connection terminal 55 of the signal input terminal connector 53 of the ASIC.

Step two: According to prompt of the detecting circuit 52 on the detecting apparatus, determine if the ESD protection chip 54 is properly soldered on the ASIC, the specific steps are as follows:

When the ESD protection chip 54 is properly soldered on the ASIC, the direct current power supply, which is connected between the ground connection terminal of the detecting apparatus and the LVDS connection terminal 55, and the detecting branch 56 cannot form a loop, and the detecting portion of each said detecting branch 56 prompts in a first way;

When the electrostatic discharge protection chip is abnormally soldered on the ASIC, the direct current power supply, which is connected between the ground connection terminal of the detecting apparatus and at least one LVDS connection terminal, and the detecting branch 56 and the ESD protection chip 54 form a loop, and the detecting portion of the detecting branch 56 prompts in a second way.

Wherein, the detecting portion of each said detecting branch 56 is a light emitting diode or a buzzer; the detecting portion prompting in the first way is the light emitting diode not emitting light or the buzzer not sounding; the detecting portion prompting in the second way is the light emitting diode emitting light or the buzzer sounding.

In summary, the apparatus and method for detecting the abnormal soldering of an electrostatic discharge protection chip according to the embodiment of the present invention provides a detecting apparatus, and the connector 51 and at least one detecting branch 56 are set in the detecting apparatus. Connect the detecting apparatus with the signal input terminal connector 53 of the application specific integrated circuit chip (ASIC) of the liquid crystal display. By detecting the status of the detecting portion in the detecting branch 56 (such as the first way and the second way), it can be known whether the ESD protection chip 54 of the ASIC is soldered abnormally (such as soldered reversely). For example, the detecting branch 56 can be a light emitting diode or a buzzer. When the light emitting diode emits light or the buzzer sounds, it determines that the ESD protection chip 54 is soldered abnormally. If the light emitting diode doesn't emit light or the buzzer doesn't sound, it determines that the ESD protection chip 54 is soldered normally.

According to the embodiment of the present invention, the operation of the detecting process is very simple and quick with very high accuracy, which can save the cost of manpower and resources, as well as to reduce the loss resulted from the defective rate of the finished product assembly.

The disclosed embodiments are the preferred embodiments of the present invention, but not intending to impose any unduly constraint to the appended claims. Any equivalent change is considered encompassed in the scope of protection defined by the claims of the present invention.

What is claimed is:

1. An apparatus for detecting the abnormal soldering of an electrostatic discharge protection chip comprising:
    a connector, which is used for pluggable connection with a signal input terminal connector of an application specific integrated circuit chip (ASIC) of a liquid crystal display, the inside of the connector provided with a ground connection terminal and at least one low-voltage differential signal (LVDS) connection terminal, one end of the said ground connection terminal used to be connected with the ground connection terminal of the signal input terminal connector of the ASIC, the said at least one LVDS connection terminal connected with at least one LVDS connection terminal of the signal input terminal connector of the ASIC; and
    a detecting circuit set on the connector, the detecting circuit comprising:
    a direct current power supply, the negative electrode of which is connected with the other end of the ground connection terminal; and at least one detecting branch connected between the positive electrode of the direct current power supply and a LVDS connection terminal of the connector, each said detecting branch comprising a detecting portion, the positive electrode of the detecting portion being connected with the positive electrode of the direct current power supply, the negative electrode of the detecting portion being connected with the LVDS connection terminal; the detecting portion prompting when the abnormal soldering of the electrostatic discharge protection chip and the ASIC is detected;
    wherein, the electrostatic discharge protection chip comprises multiple LVDS connecting pins, each LVDS connecting pin is respectively connected with the LVDS connection terminal of the signal input terminal connector of the ASIC and the LVDS connection terminal of the connector;

wherein, when the electrostatic discharge protection chip is properly soldered on the ASIC, the connector is electrically connected with the signal input terminal connector of the ASIC, the direct current power supply and each detecting branch cannot form a loop, and the detecting portion of each said detecting branch prompts in a first way; when the electrostatic discharge protection chip is abnormally soldered on the ASIC, the connector is electrically connected with the signal input terminal connector of the ASIC, the direct current power supply, at least one detecting branch and the electrostatic discharge protection chip form a loop, and the detecting portion of the detecting branch prompts in a second way.

2. The apparatus for detecting the abnormal soldering of an electrostatic discharge protection chip as claimed in claim 1, wherein each said detecting branch further comprises a current-limiting resistor in series with the detecting portion.

3. The apparatus for detecting the abnormal soldering of an electrostatic discharge protection chip as claimed in claim 1, wherein the detecting portion of each said detecting branch is a light emitting diode or a buzzer; the detecting portion prompting in the first way is the light emitting diode not emitting light or the buzzer not sounding; the detecting portion prompting in the second way is the light emitting diode emitting light or the buzzer sounding.

4. A method for detecting the abnormal soldering of an electrostatic discharge protection chip comprising:
   inserting a connector of a detecting apparatus into a signal input terminal connector of an ASIC of a liquid crystal display by electrically connection;
   according to the prompt of a detecting circuit on the detecting apparatus, determining whether the electrostatic discharge protection chip is properly soldered on the ASIC;
   wherein, the electrostatic discharge protection chip comprises multiple LVDS connecting pins, each LVDS connecting pin is respectively connected with a LVDS connection terminal of the signal input terminal connector of the ASIC and a LVDS connection terminal of the connector;
   wherein, when the electrostatic discharge protection chip is properly soldered on the ASIC, the connector is electrically connected with the signal input terminal connector of the ASIC, a direct current power supply and each detecting branch in the detecting circuit cannot form a loop, and a detecting portion of each said detecting branch prompts in a first way; when the electrostatic discharge protection chip is abnormally soldered on the ASIC, the connector is electrically connected with the signal input terminal connector of the ASIC, the direct current power supply, at least one detecting branch and the electrostatic discharge protection chip form a loop, and the detecting portion of the detecting branch prompts in a second way.

5. The method for detecting the abnormal soldering of an electrostatic discharge protection chip as claimed in claim 4, wherein the practical steps of inserting the connector of the detecting apparatus into the signal input terminal connector of the ASIC of the liquid crystal display by electrically connection are as follows:
   the detecting apparatus is inserted into the signal input terminal connector of the ASIC of the liquid crystal display, which makes the ground connection terminal set inside the connector be connected with the ground connection terminal of the signal input terminal connector of the ASIC, and makes at least one LVDS connection terminal set inside the connector be connected with at least one LVDS connection terminal of the signal input terminal connector of the ASIC.

6. The method for detecting the abnormal soldering of an electrostatic discharge protection chip as claimed in claim 4, wherein the detecting portion of each said detecting branch is a light emitting diode or a buzzer; the detecting portion prompting in the first way is the light emitting diode not emitting light or the buzzer not sounding; the detecting portion prompting in the second way is the light emitting diode emitting light or the buzzer sounding.

\* \* \* \* \*